(12) United States Patent  
Kanazawa et al.

(10) Patent No.: US 7,521,384 B2  
(45) Date of Patent: Apr. 21, 2009

(54) METHOD AND APPARATUS FOR PEELING SURFACE PROTECTIVE FILM

(75) Inventors: Masaki Kanazawa, Mitaka (JP); Minoru Ametani, Mitaka (JP); Daisuke Akita, Mitaka (JP); Motoi Nezu, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 351 days.

(21) Appl. No.: 11/544,189

(22) Filed: Oct. 5, 2006

(65) Prior Publication Data

US 2007/0087475 A1    Apr. 19, 2007

(30) Foreign Application Priority Data

Oct. 14, 2005   (JP) .............................. 2005-299855

(51) Int. Cl.
*H01L 21/46* (2006.01)
*H01L 21/30* (2006.01)
*H01L 21/78* (2006.01)
*H01L 21/00* (2006.01)

(52) U.S. Cl. .................. 438/976; 438/455; 438/458; 438/459; 438/465; 438/977

(58) Field of Classification Search ................ 438/455, 438/458, 459, 465, 976, 977
See application file for complete search history.

(56) References Cited

U.S. PATENT DOCUMENTS

| | | | |
|---|---|---|---|
| 4,631,103 A | | 12/1986 | Ametani |
| 5,282,918 A | * | 2/1994 | Heist et al. .................. 156/344 |
| 5,492,590 A | * | 2/1996 | Sakai .......................... 156/344 |
| 5,641,714 A | | 6/1997 | Yamanaka |
| 5,891,298 A | | 4/1999 | Kuroda et al. |
| 6,149,758 A | * | 11/2000 | Tsujimoto et al. ........... 156/344 |
| 6,159,827 A | | 12/2000 | Kataoka et al. |
| 6,273,791 B1 | | 8/2001 | Kataoka et al. |
| 6,616,799 B2 | | 9/2003 | Tsujimoto et al. |

(Continued)

FOREIGN PATENT DOCUMENTS

EP        0 977 254 A2      2/2000

(Continued)

OTHER PUBLICATIONS

European Search Report dated Aug. 28, 2007, for EP 0612224639, in the name of Tokyo Seimitsu Co., Ltd.

(Continued)

*Primary Examiner*—Luan C Thai
(74) *Attorney, Agent, or Firm*—Christie, Parker & Hale, LLP (57) ABSTRACT

A method and an apparatus for peeling a surface protective film attached on the surface of a semiconductor wafer are provided. A heating block is set in proximity to the whole surface of the semiconductor wafer, and the whole surface protective film is heated by the heating block. Thus, the air bubbles existing between the semiconductor wafer and the surface protective film are expanded or swelled, and the adhesion between the semiconductor wafer and the surface protective film is weakened. After that, the surface protective film is peeled from the semiconductor wafer. As a result, a peel starting point can be appropriately formed and damage to the wafer can be prevented.

6 Claims, 4 Drawing Sheets

U.S. PATENT DOCUMENTS

| | | |
|---|---|---|
| 7,060,154 B2 * | 6/2006 | Yamamoto et al. .......... 156/267 |
| 2005/0032332 A1 | 2/2005 | Miyamoto et al. |
| 2005/0164509 A1 | 7/2005 | Koshimizu et al. |
| 2007/0074822 A1 | 4/2007 | Akechi |

FOREIGN PATENT DOCUMENTS

| | | |
|---|---|---|
| EP | 1 061 559 A2 | 12/2000 |
| EP | 1 354 925 A1 | 10/2003 |
| EP | 1 679 276 A1 | 7/2006 |
| JP | 2004-128147 | 4/2004 |
| JP | 2004-165570 | 6/2004 |
| JP | 2005-150453 | 6/2005 |
| KR | 97-53305 | 7/1997 |
| KR | 2000-0070277 | 11/2000 |
| KR | 2005-0077476 | 8/2005 |
| WO | WO 2005/037698 A1 | 4/2005 |

OTHER PUBLICATIONS

Patent Abstracts of Japan, Publication No. 2005-150453, dated Jun. 9, 2005, in the name of Noriyoshi Fujii et al.

Korea Certificate of Patent dated Jul. 7, 2008, for corresponding Korea application 2006-0099997, with English translation.

European Search Report dated Nov. 11, 2007 for corresponding European Patent Application No. 06122246.9.

Korean Office action, and English translation, dated Oct. 30, 2007 for corresponding Korean Patent Application No. 10-2006-0099997.

Patent Abstracts of Japan, Publication No. 2004128147 A, Published on Apr. 22, 2004, in the name of Yamamoto.

Patent Abstracts of Japan, Publication No. 2004165570 A, Published on Jun. 10, 2004, in the name of Yamamoto.

Singapore Search Report dated Feb. 2, 2007, for SG 200606929-8, corresponding to Japan priority JP 2005-299855, in the name of Tokyo Seimitsu Co., Ltd.

* cited by examiner

METHOD AND APPARATUS FOR PEELING SURFACE PROTECTIVE FILM

CROSS-REFERENCE TO RELATED APPLICATION

This application claims priority of Japanese Patent Application Number 2005-299855, filed on Oct. 14, 2005.

BACKGROUND OF THE INVENTION

1. Field of the Invention

This invention relates to a method for peeling a film attached on the surface of a semiconductor wafer or, in particular, to a film peeling method for peeling a surface protective film attached on the surface of a very thin semiconductor wafer and a film peeling apparatus for carrying out the method.

2. Description of the Related Art

In the first half of the semiconductor fabrication process, the periphery of the semiconductor wafer is chamfered to prevent cracking, cuts or dust during the semiconductor fabrication process. Normally, the semiconductor wafer is chamfered during the semiconductor wafer fabrication process. Semiconductor wafers chamfered and ground so as to have a mirror-finished surface are supplied as a material to the first half of the semiconductor fabrication process.

In chamfering the semiconductor wafer, the upper and lower edges of the semiconductor wafer are ground into a taper using a grinding stone or the like, and polished. A circuit element is formed on the surface of the semiconductor wafer chamfered in this way. The trend in the semiconductor fabrication field is toward larger semiconductor wafers. In order to increase the mounting density, on the other hand, the thickness of semiconductor wafers has continued to decrease. A back grind process for grinding the back surface of the semiconductor wafer is conducted to reduce the thickness of the semiconductor wafer. The back grind process has recently reduced the thickness of semiconductor wafers to 100 µm or less. Further, the research and development efforts are aimed at providing a thickness of 50 µm or less. Before the back grind process, a surface protective film for protecting the circuit element is attached to the front surface of the wafer.

The back grind process is a process to extremely reduce the thickness of the semiconductor wafer, and therefore, during the back grind operation, the peripheral portion of the wafer is liable to be cracked or cut. Especially, a semiconductor wafer thickness not larger than 100 µm results in a lower mechanical strength of the semiconductor wafer and cracking or cuts can occur.

The surface protective film attached to protect the circuit element formed on the front surface of the semiconductor wafer is required to be peeled after the back grind process. In the prior art, a peeling tape is attached over the whole of the surface protective film of the semiconductor wafer by an application roller, and after attaching and bonding the peeling tape on the surface protective film, the peeling tape coupled with the surface protective film is wound off thereby to peel off the surface protective film.

The very thin semiconductor wafer after the back grind process, however, is greatly reduced in mechanical strength and, therefore, a problem is posed that the semiconductor wafer can be broken when attaching the peeling tape on the surface protective film. Further, the semiconductor wafer may be broken during the peeling process.

In order to solve these problems, Japanese Unexamined Patent Publication No. 2004-165570 discloses a method in which the direction of the semiconductor wafer is adjusted in such a manner that the direction of the peeling tape fails to coincide with the dicing grooves formed on the semiconductor wafer. Also, Japanese Unexamined Patent No. 2004-128147 discloses a peeling device in which the peeling operation is started from a corner of the semiconductor wafer.

After the back grind process, the thickness of the semiconductor wafer is considerably reduced, and therefore the back surface of the semiconductor wafer subjected to the back grind process is attached on the dicing tape, then the dicing tape is fixed on a frame slightly larger than the semiconductor wafer. Thus, the handling of the semiconductor wafer is facilitated.

After that, the semiconductor wafer is supplied to the peeling device together with the frame. In the peeling device, the peeling tape is attached on the surface protective film by a peeling member, and then the peeling member is moved along the surface of the semiconductor wafer so that the surface protective film is peeled.

As described in Japanese Unexamined Patent No. 2004-165570, the thickness of the semiconductor wafer is considerably reduced and the edge of the semiconductor wafer is formed as a chamfered portion. The peeling member pressed against the edge of the semiconductor wafer mounted on a frame via the dicing tape may slip off from the chamfered portion. In such a case, the peeling tape of the peeling member and the dicing tape may stick to each other, with the result that a peel starting point may not be appropriately formed. Also, if the peeling member attached to the dicing tape is forcibly separated, a large force is applied on the edge of the wafer and the wafer can be broken.

This invention has been achieved in view of the aforementioned situation, and the object of the invention is to provide a film peeling method and a film peeling apparatus for carrying out the method, in which a peel starting point of the surface protective film can be easily formed in order to prevent cracking or cutting of the forward end of the semiconductor wafer which otherwise might be caused at the time of starting to peel the surface protective film.

SUMMARY OF THE INVENTION

In order to achieve the aforementioned object, according to a first aspect of the invention, there is provided a surface protective film peeling method for peeling a surface protective film attached on a surface of a semiconductor wafer, comprising the steps of setting a heating block in proximity to the whole surface of the semiconductor wafer, heating the whole surface protective film with the heating block thereby to expand air bubbles existing between the semiconductor wafer and the surface protective film and/or air bubbles in the pressure sensitive adhesive of the surface protective film, thereby weakening the adhesion between the semiconductor wafer and the surface protective film, and then peeling the surface protective film from the semiconductor wafer.

The heating block is set in proximity to the surface of the semiconductor wafer and heated. The air bubbles existing between the semiconductor wafer and the surface protective film and/or the air bubbles in the pressure sensitive adhesive of the surface protective film are expanded or swelled over the whole surface of the semiconductor wafer thereby to weaken the adhesion between the semiconductor wafer and the surface protective film, after which the surface protective film is peeled from the semiconductor wafer. In this way, the cracking or cutting of the semiconductor wafer are avoided while, at the same time, making it possible to peel the surface protective film easily and with a low peeling force.

According to a second aspect of the invention, there is provided a surface protective film peeling method for peeling a surface protective film attached to a surface of a semiconductor wafer, comprising the steps of setting a heating block in proximity to at least a part of the neighborhood of the outer peripheral portion of the semiconductor wafer, heating the neighborhood of the outer peripheral portion of the surface protective film corresponding to the heating block thereby to expand air bubbles existing between the semiconductor wafer and the surface protective film and/or air bubbles in the pressure sensitive adhesive of the surface protective film, thereby weakening the adhesion between the semiconductor wafer and the surface protective film, and peeling the surface protective film from the neighborhood of the outer peripheral portion of the semiconductor wafer heated with the heating block.

In the second aspect, the heating block is set in proximity to a first portion including at least a part of the neighborhood of the outer peripheral portion of the semiconductor wafer and heated thereby to expand or swell the air bubbles existing between the semiconductor wafer and the surface protective film and/or the air bubbles in the pressure sensitive adhesive of the surface protective film, thereby making it possible to form a peel starting point weakened in adhesion between the semiconductor wafer and the surface protective film. When peeling the surface protective film from the semiconductor wafer, therefore, the cracking or cutting of the semiconductor wafer is avoided.

According to a third aspect of the invention, there is provided a surface protective film peeling method, for peeling a surface protective film attached on a surface of a semiconductor wafer, comprising the steps of feeding a peeling tape onto the surface of the semiconductor wafer, heating the surface protective film of the semiconductor wafer via the peeling tape by a peeling bar having a heating mechanism built therein, thereby expanding air bubbles existing between the semiconductor wafer and the surface protective film and/or air bubbles in the pressure sensitive adhesive of the surface protective film and weakening the adhesion between the semiconductor wafer and the surface protective film, and then peeling the surface protective film from the semiconductor wafer together with the peeling tape using the peeling bar.

In the third aspect, the heating mechanism is built into the peeling bar, the surface protective film is heated via the peeling tape by the heating mechanism, and the air bubbles existing between the semiconductor wafer and the surface protective film and/or the air bubbles in the pressure sensitive adhesive of the surface protective film are expanded or swelled thereby to weaken the adhesion between the semiconductor wafer and the surface protective film under the peeling bar, after which the surface protective film is peeled from the semiconductor film. In this way, the semiconductor wafer is prevented from cracking or being cut.

According to a fourth aspect of the invention, there is provided a surface protective film peeling apparatus for peeling a surface protective film attached to a surface of a semiconductor wafer, comprising a heating block covering the whole surface of the semiconductor wafer, wherein the whole of the surface protective film is heated by the heating block set in proximity to the whole surface of the semiconductor wafer, thereby expanding air bubbles existing between the semiconductor wafer and the surface protective film and/or air bubbles in the pressure sensitive adhesive of the surface protective film and weakening the adhesion between the semiconductor wafer and the surface protective film, and then the surface protective film is peeled from the semiconductor wafer.

In the fourth aspect, similar effects to the first aspect can be produced.

According to a fifth aspect of the invention, there is provided a surface protective film peeling apparatus for peeling a surface protective film attached on a surface of a semiconductor wafer, comprising a heating block covering at least a part of the neighborhood of the outer peripheral portion of the semiconductor wafer, wherein the whole of the surface protective film is heated by the heating block set in proximity to the neighborhood of the outer peripheral portion of the semiconductor wafer, thereby expanding air bubbles existing between the semiconductor wafer and the surface protective film and/or air bubbles in the pressure sensitive adhesive of the surface protective film and thus weakening the adhesion between the semiconductor wafer and the surface protective film, after which the surface protective film is peeled from the neighborhood of the outer peripheral portion of the semiconductor wafer.

In the fifth aspect, similar effects to the second aspect can be produced.

According to a sixth aspect of the invention, there is provided a surface protective film peeling apparatus for peeling a surface protective film attached on a surface of a semiconductor wafer, comprising a feeding means for feeding a peeling tape onto the surface of the semiconductor wafer, a peeling bar and a heating mechanism built in the peeling bar, wherein the peeling tape is fed onto the surface of the semiconductor wafer, and the surface protective film is heated by the heating mechanism via the peeling tape fed by the feeding means, thereby expanding air bubbles existing between the semiconductor wafer and the surface protective film and/or air bubbles in the pressure sensitive adhesive of the surface protective film and thus weakening the adhesion between the semiconductor wafer and the surface protective film, after which the surface protective film is peeled from the semiconductor wafer together with the peeling tape using the peeling bar.

In the sixth aspect, similar effects to those of the third aspect can be produced.

The respective aspects described above can produce the same effect that a peel starting point can be easily formed by the peeling means. Further, in the first aspect, the adhesion between the semiconductor wafer and the surface protective film is weakened over the whole surface of the semiconductor wafer, and therefore the surface protective film can be peeled with a very low force.

These and other objects, features and advantages of the present invention will be more apparent in light of the detailed description of exemplary embodiments thereof as illustrated by the drawings.

DETAILED DESCRIPTION OF THE INVENTION

In the drawings explained below, the same component members are designated by the same reference numerals. To facilitate understanding, the scale of these drawings is appropriately changed.

Figure 1:
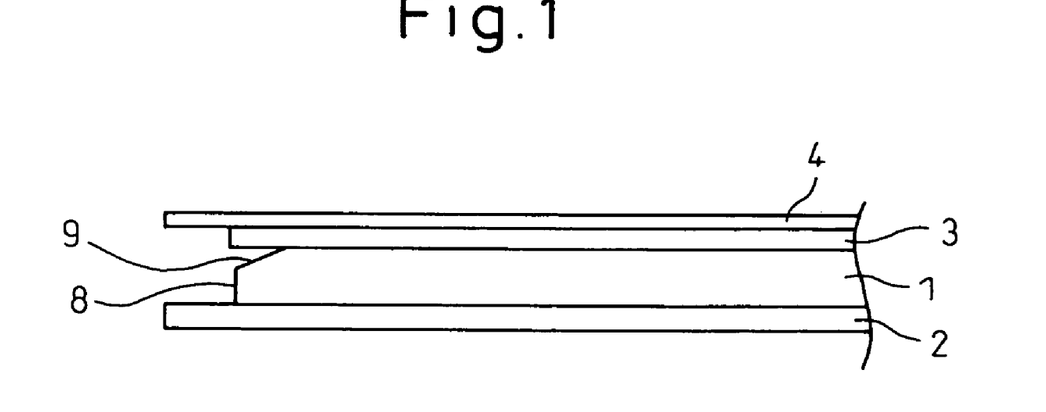
FIG. 1 is a side sectional view showing the ordinary manner in which the surface protective film is peeled after the back grind process according to the prior art.

FIG. 1 is a sectional view showing the conventional semiconductor wafer after the back grind process. A dicing tape 2 is attached on the back surface of a wafer 1. Also, a surface protective film 3 is attached on the front surface of the wafer 1 on which circuit elements (not shown) are formed. The wafer 1 shown in FIG. 1 is subjected to the back grind process to some degree, and therefore an end surface 8 and only one chamfered portion 9 of the wafer 1 are shown, while the other chamfered portion is not shown.

The wafer 1 shown in FIG. 1 is subjected to a further back grind process to, say, 100 µm in the thickness as a semiconductor wafer. Then, the cross section is changed from the shape shown in FIG. 1 to the shape shown in FIG. 2. Specifically, in FIG. 2, the portion corresponding to the end surface 8 is ground and therefore a knife edge portion 5 of the chamfered portion 9 presents itself, with the result that cracking or cutting is easily caused.

Figure 2:
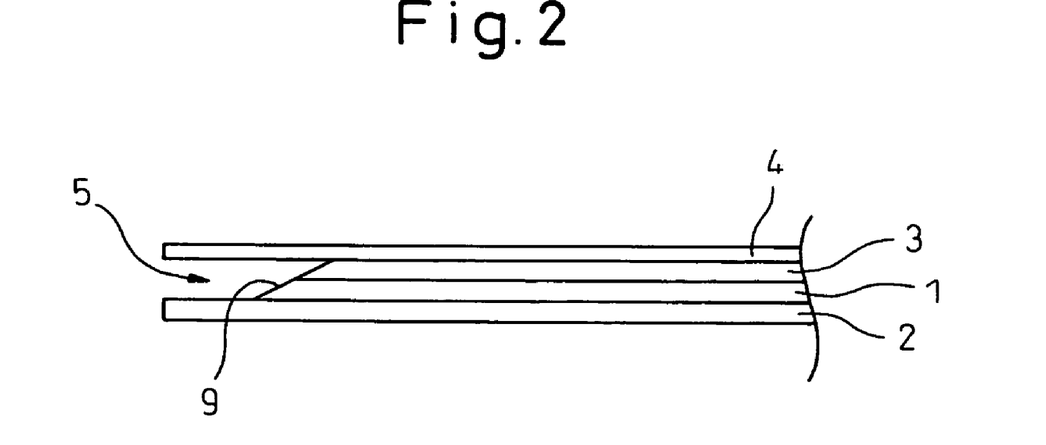
FIG. 2 is a side sectional view showing the manner in which the surface protective film is peeled from a semiconductor wafer not thicker than 100 μm.

In order to prevent the cracking or the cutting of the semiconductor wafer, a peeling tape 4 is attached on the surface protective film 3 in such a manner that the peeling tape 4 is pressed under an appropriate pressure onto the edge of the semiconductor wafer and into close contact with the surface protective film 3. For most of the remaining part of the semiconductor wafer, the peeling tape 4 is preferably only kept in contact with the surface protective film 3 without pressure or completely raised from the surface protective film 3. In other words, the surface protective film 3 is desirably peeled with a weak peeling force.

Figure 3A:
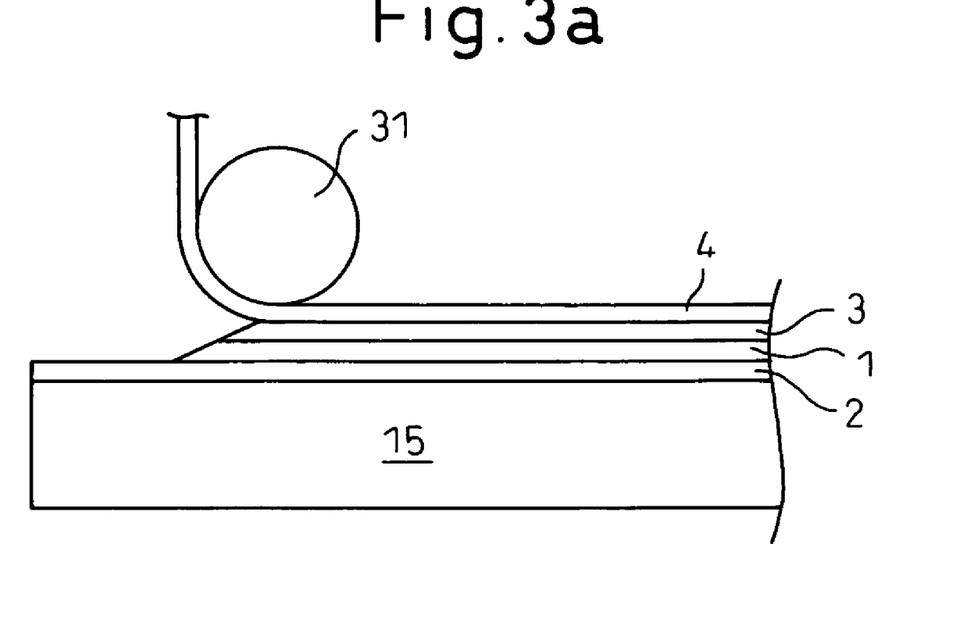
FIG. 3a is a diagram showing the semiconductor wafer being wound up at 90° using a peeling roll.
Figure 3B:
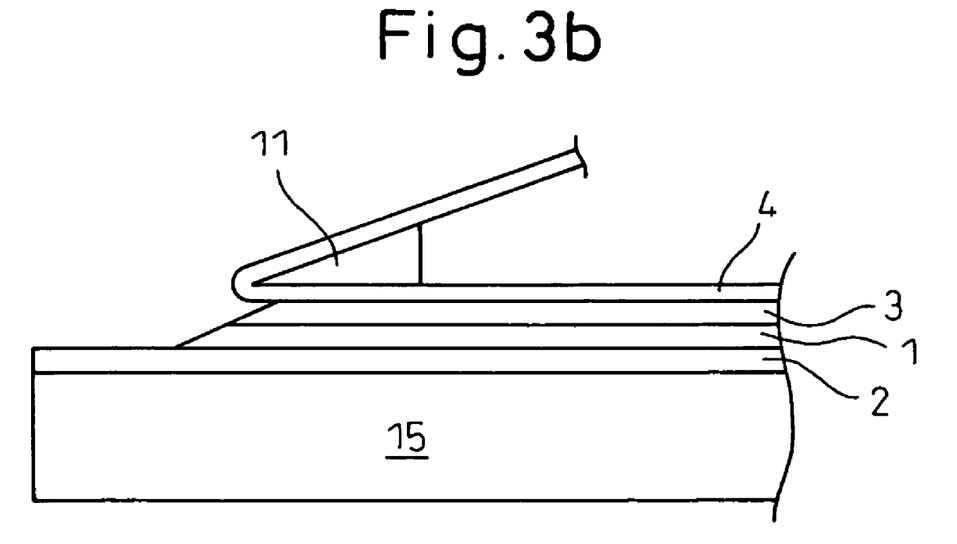
FIG. 3b is a diagram showing the semiconductor wafer being wound up at 180° using a peeling bar.

FIG. 3a is a diagram showing the manner in which the peeling tape on the semiconductor wafer is wound up at 90° using a peeling roll 31. FIG. 3b, on the other hand, is a diagram showing the manner in which the peeling tape on the semiconductor wafer is wound up by 180° using a peeling bar 11. The surface protective film 3 is peeled while maintaining a peeling angle of not less than 90° as shown in FIG. 3a or about 180° as shown in FIG. 3b by delaying the wind-up operation with respect to the movement of the semiconductor wafer held by the table 15 for adsorbing the back surface of the wafer 1 via the dicing tape 2.

Nevertheless, the surface protective films are available in so many types and greatly vary in their characteristics. The surface protective film 3 includes a heat sensitive adhesive film and a pressure sensitive adhesive film. Further, the base material and the pressure sensitive adhesive or heat sensitive adhesive of the surface protective film have many variations. Therefore, the peeling method or the peeling tape used for peeling, if limited in type, cannot meet the requirements.

The thickness of the base material of the surface protective film 3, though not specifically limited, is generally 70 to 500 µm or preferably about 100 to 300 µm. The adhesive layer of the surface protective film 3, though not specifically limited, is required to have at least such an adhesion as to be capable of fixing to the front surface of the semiconductor wafer 4 which is the object to be bonded, and capable of being subsequently peeled. Thus, a multipurpose weak adhesive or an ultraviolet curing adhesive may be employed.

In the case where the ultraviolet curing adhesive is used, the ultraviolet light is preferably radiated on the adhesive layer before peeling the surface protective film 3 to reduce or remove the adhesion. In such a case, ultraviolet light radiation equipment is required.

As described above, however, the surface protective film 3 is available in so many types that the characteristics vary greatly from one surface protective film to another. A photosensitive adhesive film, a heat sensitive adhesive film and a pressure sensitive adhesive film also exist. Also, the base material and the pressure sensitive adhesive of the surface protective film 3 have many variations. Research and development efforts are still under way on these points.

The thickness of the base material of the peeling tape 4 is not specifically limited. In the case where the peeling tape 4 is bonded to the surface protective film 3 by a heat seal adhesive, the thickness of the base material of the peeling tape 4 is preferably not more than 300 µm or, specifically, is 75 to 250 µm, to secure the heat transmission.

The peeling tape 4 is bonded to the end of the surface protective film 3. In the case where the circuit elements are formed on the front surface of the semiconductor wafer, the peeling tape is bonded at the forward end of the surface protective film stuck on the peripheral edge of the wafer where the circuit elements are not formed.

The bonding means is not specifically limited as long as it can firmly bond the surface protective film 3 and the peeling tape 4 to each other. In order to secure a sufficient bonding strength, however, the bonding means may be a heat seal adhesive. The heat seal adhesive is appropriately selected taking the material of the surface protective film 3 and the material of the peeling tape 4 into consideration. In the case where both the surface protective film 3 and the peeling tape 4 are formed of polyethylene telephthlate, for example, an acrylic heat seal adhesive is preferable as the bonding means.

A combination of any of the surface protective films for the semiconductor wafer and any of various peeling tapes 4 is used to peel the surface protective film 3. In the case where the surface protective film 3 is peeled with the semiconductor wafer 1 and the surface protective film 3 firmly bonded to each other, however, the wafer may be broken, and an effective solution has yet to be discovered.

In order to meet this situation, a new solution is proposed hereby.

When the surface protective film 3 is attached onto the front surface of the semiconductor wafer 1, a multiplicity of air bubbles 50 are formed between the surface protective film 3 and the semiconductor wafer 1. These bubbles 50 are liable to be formed around the circuit elements and the neighborhood of the streets or the channels between the circuit elements. Further, a multiplicity of air bubbles 50 are also dispersed in the adhesive layer, for example the pressure sensitive adhesive layer, of the surface protective film 3. Some of these bubbles 50 are visible, while others cannot be seen with a naked eye.

By heating the surface of the semiconductor wafer 1 with the surface protective film 3 attached thereon, the air (air bubbles 50) dispersed in the adhesive of the surface protective film 3 and/or the air (air bubbles 50) contained around the circuit elements or the streets or the channels on the front surface of the semiconductor wafer are heated. As a result, the volume of the air bubbles 50 increases and the surface protective film 3 is raised from the front surface of the semiconductor wafer 1. Thus, the adhesion between the semiconductor wafer and the surface protective film is weakened.

Consequently, the peeling operation of the surface protective film 3 is facilitated. In other words, a part of the surface protective film 3 raised from the front surface of the semiconductor wafer 1 can be used as a peel starting point.

With the decrease in temperature, however, the air thus far expanded or swelled, shrinks again and the volume of the air bubbles is reduced, thereby often making the peeling more difficult than before the heating. For this reason, the surface protective film is required to be peeled off while the air bubbles 50 of the adhesive between the semiconductor wafer 1 and the surface protective film 3 are expanded or swelled and the adhesion is weakened between the semiconductor wafer 1 and the surface protective film 3.

Figure 4A:
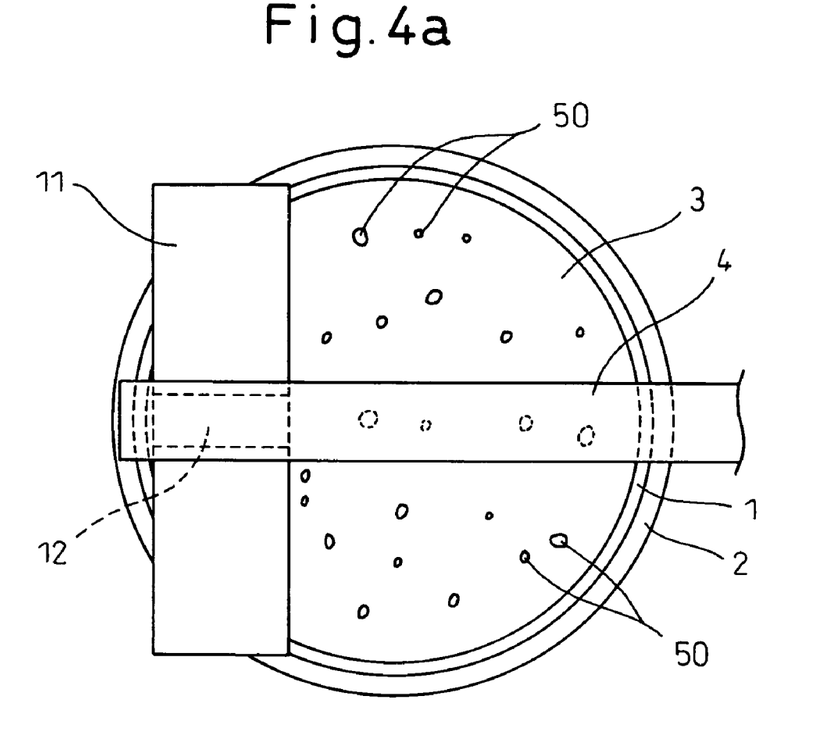
FIG. 4a is a front view showing a peeling bar having a heating mechanism built therein.
Figure 4B:
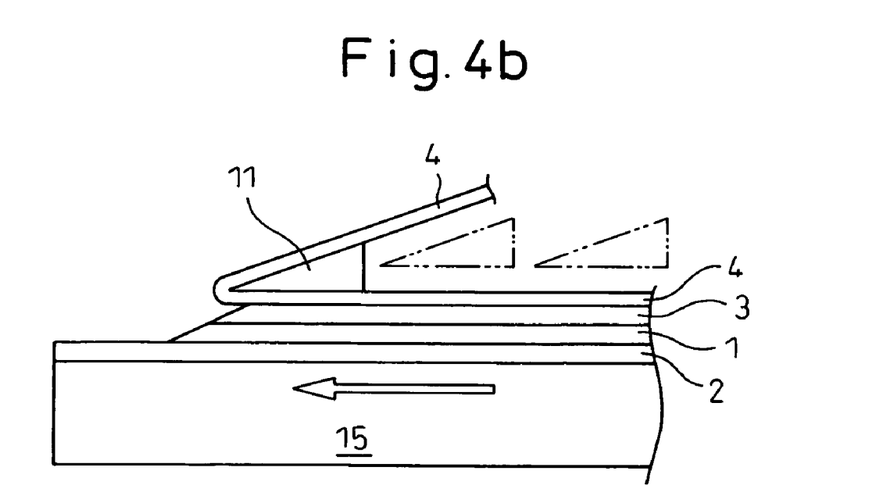
FIG. 4b is a side view showing a peeling bar having a heating mechanism built therein.

In FIG. 4 showing an embodiment of the invention, a heating block 12 is built in a peeling bar 11 extending in the direction perpendicular to the direction of the peeling tape 4. As shown in FIG. 4, the heating block 12 is installed at about the center of the peeling bar 11. In other words, the heating block 12 is installed at a position on the outer periphery of the semiconductor wafer 1 which is located in the area of the peeling tape 4. The surface protective film 3 is heated via the peeling tape 4 by the heating block 12 of the peeling bar 11. As a result, the air bubbles 50 formed between the semiconductor wafer 1 and the surface protective film 3 and/or the air bubbles 50 in the adhesive of the surface protective film are expanded or swelled, and the adhesion is weakened between the semiconductor wafer and the surface protective film. Thus, the surface protective film 3 is partially raised from the front surface of the semiconductor wafer 1. At the same time, the peeling tape 4 is pulled up, thereby making it possible to easily peel the surface protective film 3.

Figure 5A:
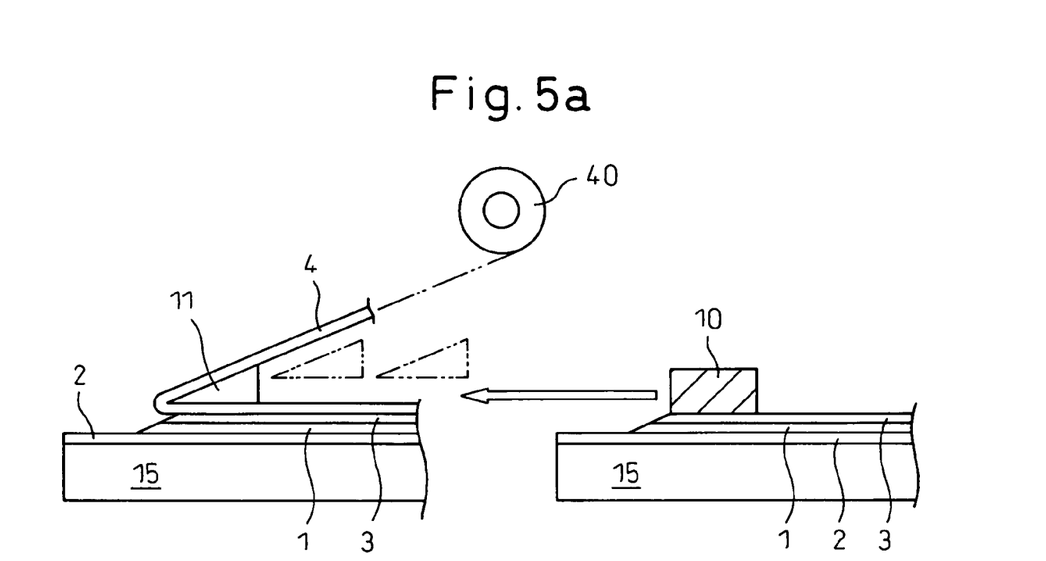
FIG. 5a is a diagram showing the manner in which the peeling tape is bonded with the forward movement of a table after the heat stamp process.

The peeling bar 11 and the heating block 12 may be separate members. FIG. 5a is a diagram showing the manner in which the peeling tape is bonded by the forward movement of the table after the heat stamp process in which the heating unit stamps the surface protective film. FIG. 5a (and FIG. 5b) shows the heating unit 10 and the peeling unit including the peeling bar 11 arranged in tandem. As shown in FIG. 5a, after heating a part of the outer peripheral portion of the surface protective film 3 with the heating unit 10 or the like, the peeling tape 4 is immediately attached on the surface protective film 3 by the supply means 40. Then, the table 15 is moved forward to thereby peel the surface protective film 3 together with the peeling tape 4. In this case, the peeling tape is not directly heated, and therefore a multipurpose adhesive tape can be used as the peeling tape without regard to the heat resistance of the peeling tape 4.

Incidentally, in the case that the heating unit 10 and the peeling unit are exchanged, the surface protective film 3 may alternatively be peeled with the peeling tape 4 by moving the table 15 backward.

Figure 5B:
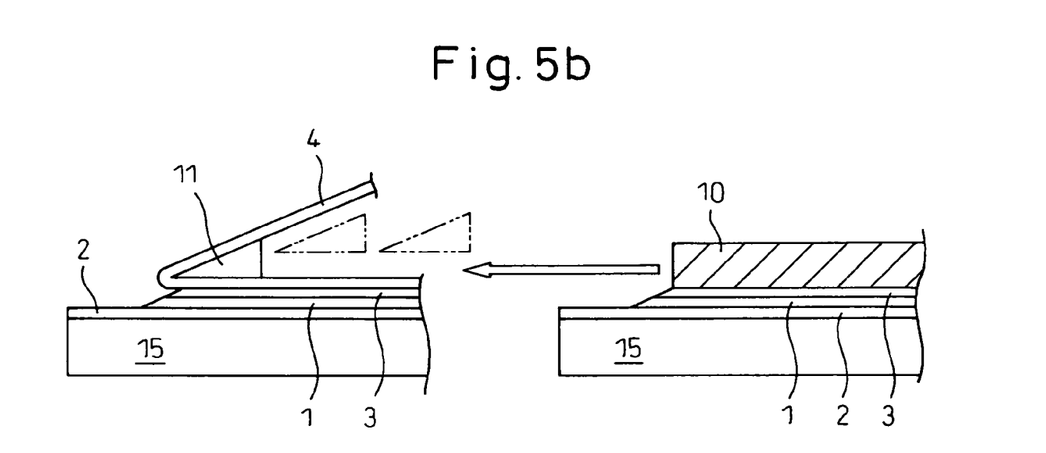
FIG. 5b is a diagram similar to FIG. 5a according to another embodiment.

FIG. 5b is a diagram showing another embodiment similar to FIG. 5a. The heating unit 10 shown in FIG. 5b is sufficiently large to cover the whole surface of the semiconductor wafer 1. The whole of the surface protective film 3 on the semiconductor wafer 1 may be heated by this heating unit 10, in which case the peel starting point can be formed in similar fashion.

The heating temperature of the heating unit 10 and the heating block 12 is selected within the range of the temperature (about 70° C.) at which the air bubbles in the surface protective film 3 are expanded or swelled to the temperature (about 250° C.) at which the surface protective film is melted. Further, the heating time corresponding to the selected temperature is set. Also, the temperature conditions may be selected in accordance with the material of the tape or the film.

Actual evaluation shows that the air layer is expanded or swelled at the temperatures of 150 to 180° C. within a short time and at least a part of the surface protective film 3 is raised from the front surface of the semiconductor wafer 1. With this part as a peel starting point, the surface protective film 3 can be easily peeled.

The method and apparatus for peeling the surface protective film embodying the invention are not limited to the embodiments described above, but by expanding or swelling the air bubbles 50 in the adhesive between the semiconductor wafer and the surface protective film, the surface protective film 3 can be peeled with the adhesion weakened between the semiconductor wafer and the surface protective film.

In the embodiments described above, the surface protective film is peeled via the peeling tape. Once the adhesion of the surface protective film is weakened after heating, however, the peeling tape 4 is not necessarily used. In such a case, at least a part of the outer peripheral portion of the semiconductor wafer weakened in adhesion is raised from the semiconductor wafer 1 by adsorption or pickup, after which the raised portion is clamped with a hook, or the like, of the clamp member and can be peeled mechanically. This peeling method is also included in the scope of this invention.

Although the invention has been shown and described with exemplary embodiments thereof, it will be understood, by those skilled in the art, that the foregoing and various other changes, omissions and additions may be made therein and thereto without departing from the scope of the invention.

The invention claimed is:

1. A surface protective film peeling method for peeling a surface protective film attached on a surface of a semiconductor wafer, comprising the steps of:
   setting a heating block in proximity to the whole surface of the semiconductor wafer;
   heating the whole surface protective film with the heating block, thereby expanding air bubbles existing between the semiconductor wafer and the surface protective film and/or air bubbles in the adhesive of the surface protective film, and thus weakening the adhesion between the semiconductor wafer and the surface protective film; and
   peeling the surface protective film from the semiconductor wafer.

2. A surface protective film peeling method for peeling a surface protective film attached on a surface of a semiconductor wafer, comprising the steps of:
   setting a heating block in proximity to at least a part of the neighborhood of the outer peripheral portion of the semiconductor wafer;
   heating the neighborhood of the outer peripheral portion of the surface protective film corresponding to the heating block, thereby expanding air bubbles existing between the semiconductor wafer and the surface protective film and/or air bubbles in the adhesive of the surface protective film, and thus weakening the adhesion between the semiconductor wafer and the surface protective film; and
   peeling the surface protective film from the neighborhood of the outer peripheral portion of the semiconductor wafer heated with the heating block.

3. A surface protective film peeling method for peeling a surface protective film attached on a surface of a semiconductor wafer, comprising the steps of:
   feeding a peeling tape onto the surface of the semiconductor wafer;
   heating the surface protective film of the semiconductor wafer via the peeling tape by a peeling bar having a heating mechanism built therein, thereby expanding air bubbles existing between the semiconductor wafer and the surface protective film and/or air bubbles in the adhesive of the surface protective film, and thus weakening the adhesion between the semiconductor wafer and the surface protective film; and peeling the surface protective film from the semiconductor wafer together with the peeling tape using the peeling bar.

4. A surface protective film peeling apparatus for peeling a surface protective film attached on a surface of a semiconductor wafer, comprising:

a heating block covering the whole surface of the semiconductor wafer;

wherein the whole of the surface protective film is heated by the heating block set in proximity to the whole surface of the semiconductor wafer, thereby expanding air bubbles existing between the semiconductor wafer and the surface protective film and/or air bubbles in the adhesive of the surface protective film, and thus weakening the adhesion between the semiconductor wafer and the surface protective film, after which the surface protective film is peeled from the semiconductor wafer.

5. A surface protective film peeling apparatus for peeling a surface protective film attached on a surface of a semiconductor wafer, comprising:

a heating block covering at least a part of the neighborhood of the outer peripheral portion of the semiconductor wafer;

wherein the whole of the surface protective film is heated by the heating block set in proximity to the neighborhood of the outer peripheral portion of the semiconductor wafer, thereby expanding air bubbles existing between the semiconductor wafer and the surface protective film and/or air bubbles in the adhesive of the surface protective film, and thus weakening the adhesion between the semiconductor wafer and the surface protective film, after which the surface protective film is peeled from the neighborhood of the outer peripheral portion of the semiconductor wafer.

6. A surface protective film peeling apparatus for peeling a surface protective film attached on a surface of a semiconductor wafer, comprising:

a feeding means for feeding a peeling tape onto the surface of the semiconductor wafer;

a peeling bar; and a heating mechanism built in the peeling bar;

wherein the peeling tape is fed onto the surface of the semiconductor wafer, the surface protective film of the semiconductor wafer is heated by the heating mechanism via the peeling tape fed by the feeding means, thereby expanding air bubbles existing between the semiconductor wafer and the surface protective film and/or the bubbles in the adhesive of the surface protective film, and thus weakening the adhesion between the semiconductor wafer and the surface protective film, after which the surface protective film is peeled from the semiconductor wafer together with the peeling tape using the peeling bar.

* * * * *